United States Patent [19]

Goldstein

[11] 4,015,253
[45] Mar. 29, 1977

[54] ROTARY DIGITAL CHANNEL SELECTION APPARATUS

[75] Inventor: Richard Goldstein, Deerfield, Ill.

[73] Assignee: Dynascan Corporation, Chicago, Ill.

[22] Filed: Mar. 29, 1976

[21] Appl. No.: 671,180

[52] U.S. Cl. .................... 340/347 P; 116/115; 250/570; 325/455; 340/378 A
[51] Int. Cl.² .................................. G08C 9/06
[58] Field of Search ....... 325/455; 340/350, 378 A, 340/347 P; 116/115; 250/570

[56] References Cited

UNITED STATES PATENTS

| | | | |
|---|---|---|---|
| 2,885,992 | 5/1959 | Roberts | 340/378 A |
| 3,631,470 | 12/1971 | Bloom | 340/347 P |
| 3,740,721 | 6/1973 | Cline | 340/347 P |

*Primary Examiner*—Howard W. Britton
*Attorney, Agent, or Firm*—Wallenstein, Spangenberg, Hattis & Strampel

[57] ABSTRACT

A combination control knob and encoder drum unit, which has a number of indexing indentations corresponding to the number of desired stable positions thereof, is sized to pass through an opening in a control panel behind which is mounted a drum-receiving housing. The drum has groups of light-transparent areas each for providing a pattern of light identifying a different signal channel. The housing has a light source which passes within the drum when it is fully mounted within the housing, and a bearing adapted to receive a shaft extending from the combination knob and encoder unit. A spring loaded drum holding projection is urged toward and enters an adjacent encoder unit indentation. The housing has photocell means at a light pattern reading station to which the various groups of light-transmitting areas on the drum can be individually brought. To increase the number of channel selection positions, a combination knob and encoder unit is merely replaced by another similar unit with a different number of groups of light-transparent areas and indexing indentations.

10 Claims, 14 Drawing Figures

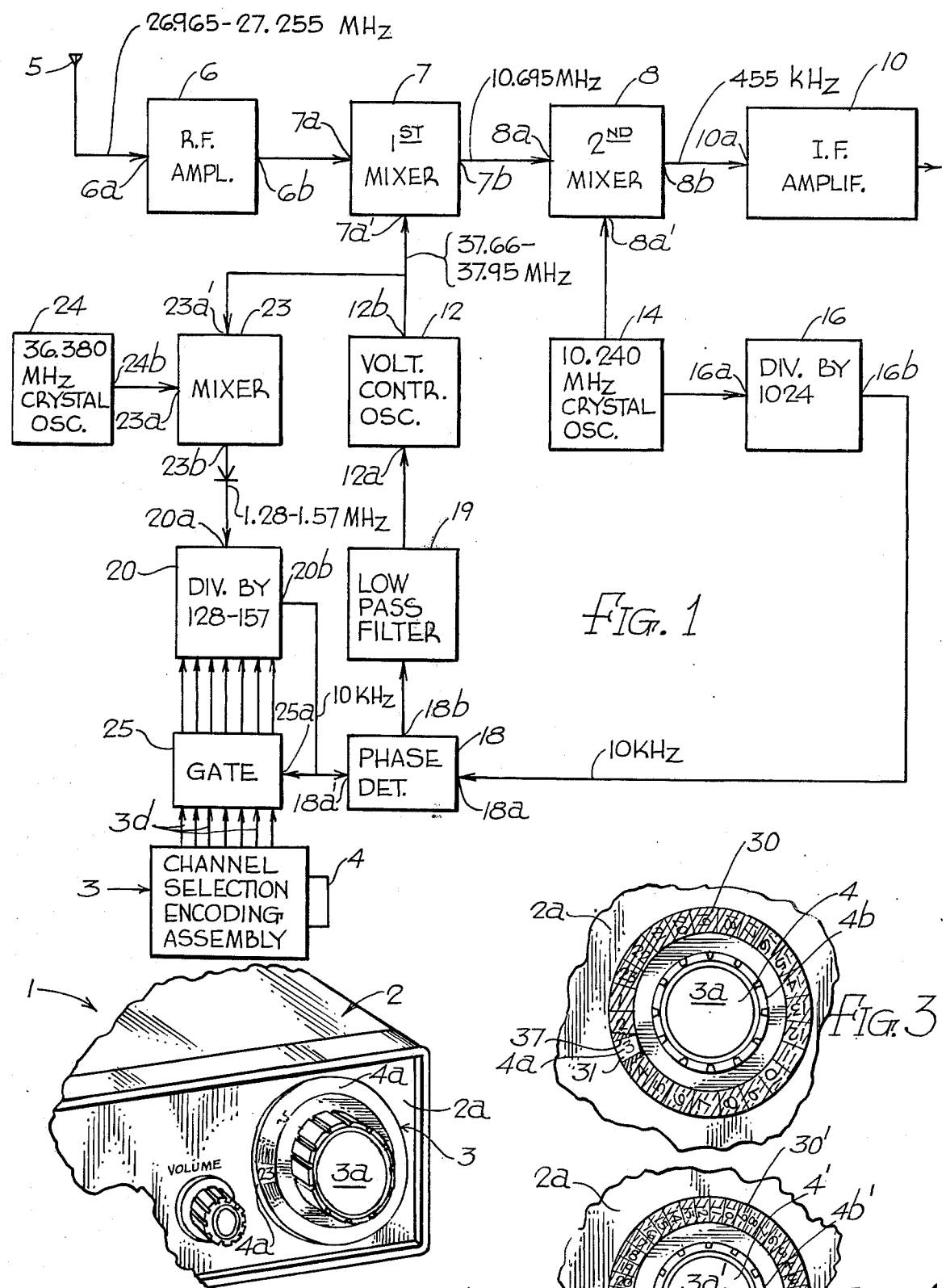

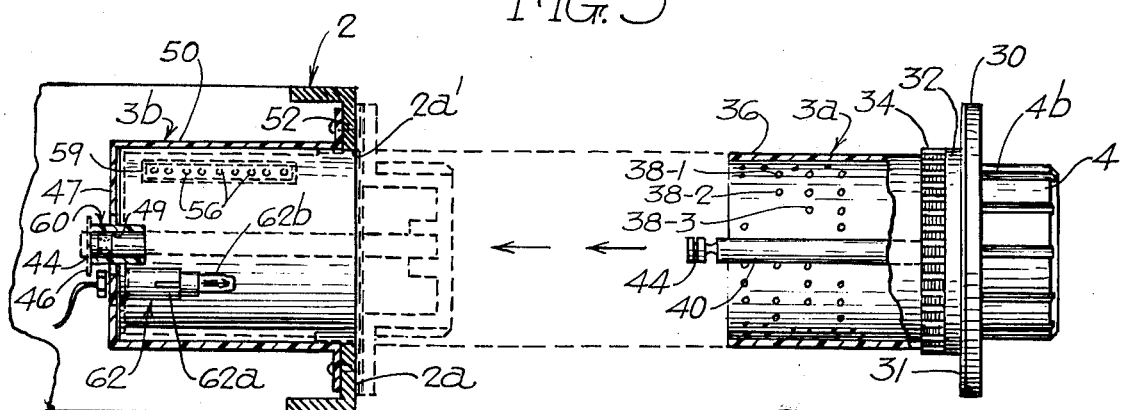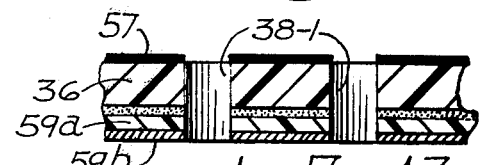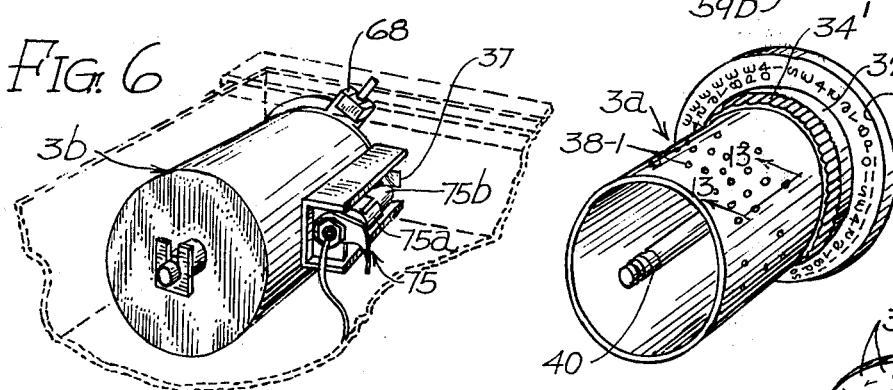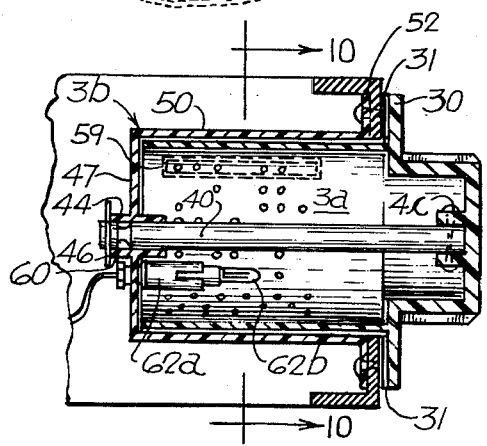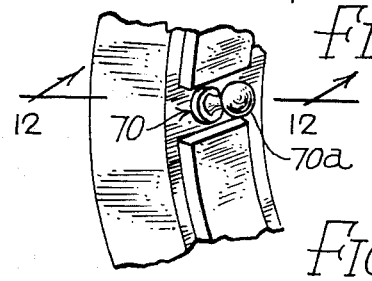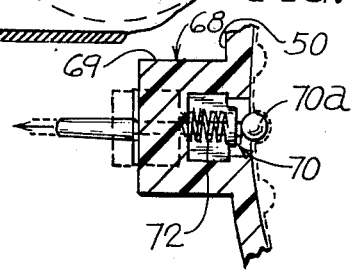

ROTARY DIGITAL CHANNEL SELECTION APPARATUS

BACKGROUND OF INVENTION

This invention relates to rotary digital encoding apparatus especially useful as a channel selection control in multi-channel radio communications equipment, particularly two-way radio transceivers for citizens' band, public radio, industrial and business applications. However, in its broader aspects the present invention is applicable to any switching requirement in which a desired operating frequency or other function is selectable by means of a digital code.

As the popularity and need for two-way radio service grows, particularly in the public sector known as the "Citizens Radio Service", overcrowding of available channels restricts the usefulness and availability of the service for all private individuals who desire it. Consequently, to expand the availability of the Citizens' Radio Service in the public interest, the Federal Communications Commission is contemplating expanding the number of channels available from the original twenty-three to some greater number which may be as high as thirty-six, forty, or seventy channels. Modern, economical design of two-way radio transceivers is seeing the rapid adoption of frequency synthesizer techniques employing digital phase-lock loop circuits for generation of the large number of discrete frequencies required in such multi-channel transceivers using a single voltage controlled variable frequency crystal stabilized local oscillator in the superhetrodyne receiver incorporated therein. Thus, the associated circuiting developed a voltage corresponding to a binary or coded binary decimal signal selected by a digital encoder switch, the voltage adjusting the local osciellator to the frequency needed to receive the desired radio signal. The availability of high performance and low cost integrated circuits for forming said phase-lock loop circuits plus the limited availability of quartz crystals have accelerated the effort to produce multi-channel synthesizers using only one or two crystals instead of the considerably larger number (twelve to twenty) formerly employed in conventional "crystal synthesizer" designs.

The digital encoder switch used to select a desired channel-indicating coded signal to be fed to the phase-lock loop circuit has been a mechanical multi-pole wafer switch. In such case, if the synthesizer is required to produce thirty different frequencies, at least a five pole, thirty position binary coded wafer switch would be required. As the number of channels increase, additional poles are required on the switch so that the binary number represented by the number of poles (digits) is equal to or greater than at least the number of channels desired. A frequency synthesizer as described is capable of generating discrete frequencies which are separated from each other by a fixed amount. The spacing between frequencies is determined by the specified channel separation of the particular communications service for which it is designed. The Citizens' Radio Service, for instance, employs ten kilohertz channel spacing for AM double sideband operation and five kilohertz for single sideband supressed carrier operation. If the channels are consecutively assigned on five or ten kilohertz steps, then the number of poles in the binary switch equals the number of binary digits required for the desired number of channels to be covered. If the channels are not assigned on a consecutive frequency interval basis, but certain channels are skipped for use by other services or otherwise prohibited, then it is the total number of intervals included between the lowest to the highest frequency channels desired that determines the number of poles on the switch. In the Citizens' Radio Service, for instance, a proposed expansion to 64 channels covering the frequency range 26.965 MHz to 27.515 MHz includes 110 five kilohertz channels. Thus, although only 64 channels might be authorized in this range, an eight pole binary switch would be required rather than a six pole switch for 64 channels covered on consecutive five kilohertz channel spacings.

Conventional rotary wafers designed for digitally coding a frequency synthesizer as described above become more complicated and costly as the number of channels increases. Futhermore, the limitation on the number of channels that can be built into such a switch if it is to be of reasonable size appears to be about forty. A fairly long lead time is required to tool up for such conventional rotary switches since each rotor design is unique to the assigned channel spacing, especially when channels are not assigned on a consecutive basis.

Conventional rotary wafer switches also have the disadvantage of poor reliability as their complexity increases. Furthermore, such switches require connection by means of wires, solder tabs or multi-pin plugs and sockets to the circuits they control. Thus, there is a significant labor cost associated with their use. This becomes a particular disadvantage if it is desired that the switch be changeable for field modification of transceivers to prevent their obsolescence when new channel frequencies are permitted and assigned. Thus, one of the main advantages of phase-lock loop frequency synthesizer designs in two-way multi-channel transceivers would be largely offset, namely, the advantage of flexibility of providing customer modification service at low cost to include new channels of an expanded service to present expensive equipment obsolescence.

Therefore, it is an object of this invention to provide a digital encoding switch means of simple design, lower cost and greater reliability than previous designs of the rotary wafer switch type.

Another object of this invention is to provide a rotary digital encoding switch of small size that could accomodate a larger number of channel selections for a phase-lock loop frequency synthesizer circuit than is possible within the practicability of the design of conventional rotary wafer switches of similar size.

A further object of this invention is to provide a rotary digital encoding switch that could accommodate a larger number of channel selections by merely substituting for the rotatable part thereof another inexpensive rotatable part which is automatically indexable to a correspondingly greater number of channel selection positions.

Another object of this invention is to provide a rotary digital encoding switch as described in which the encoding portion can be manufactured at very low cost, such as by injection molding, and in which the programming means thereof could be designed and manufactured with very short lead time, such as if produced from artwork by protographic means.

The present invention is an improvement over and a new use for the type of encoder switch disclosed in U.S. Pat. No. 3,622,793. This type of encoder suited includes a cylindrical encoder drum made of a light-opaque material provided with circumferentially spaced groups of light-transparent areas with therein for forming different groups of light patterns constituting the digits of a straight binary or binary decimal code. The drum is movable to various discrete positions where the various groups of light-transparent areas are brought opposite a light pattern reading station where an array of photocells (or other light pattern reading means) is provided. Light is directed through the light-transparent areas of the drum at the light pattern reading station, and the light pattern reading means thereat provides a pattern of electrical signals indicating the desired information represented by the position of the encoder drum. (A rotary digital encoding unit using a flat annular coding disc forming part of a tuning knob assembly of different construction from the present invention is presently being made by Tektronix, Inc.)

SUMMARY OF INVENTION

In accordance with the present invention, a cylindrical drum like that described forms an integral part of a unitary combination knob and encoder unit wherein the drum fits through a circular aperture in a control panel. Secured to the outer end of the drum is a manually operable knob preferably terminating in a radially extending flange to which various circumferentially spaced channel identifying numbers are applied in the case where the digital encoding unit is to be used to control the frequency, for example, of the local oscillator of a superheterodyne receiver through a phase-lock loop circuit, as described. The combination knob and encoder unit also has a series of circumferentially spaced position determining means, preferably indentation adapted to receive spring urged projecting means, wherein the combination knob and encoder unit is indexable into any one number of angular positions corresponding to the number of channels to be selected thereby, where a different group of light-transparent areas on the encoder drum is brought opposite a light pattern reading station.

In the most preferred form of the invention, the inner surface of the encoder drum is made of a highly light reflecting material so that the light from a relatively small light source located within the drum will, by multiple reflections therein, flood with light at least the group of light-transparent areas of the drum adjacent the light pattern reading station.

Mounted on the rear of the control panel is a preferably cylindrical drum-receiving housing which is in approximate alignment with the margins of the aperture in the control panel and of slightly greater diameter than the diameter of the encoder drum. In the preferred form of the invention, the combination knob and encoder unit is provided with a coaxially extending shaft which automatically enters a bearing support in a rear wall of the drum-receiving housing when it is fully inserted through the panel aperture into the drum-receiving housing. The knob is then positioned in front of the control panel where it is accessible to the operator. The rear wall of the drum-receiving housing preferably supports a light source which is located within the interior of the encoder drum when the combination knob and encoder unit is fully mounted within the housing. In the preferred form of the invention, the cylindrical walls of the drum-receiving housing are contiguous to the outer surface of the encoder drum and an array of photocells or other light pattern responsive means are preferably positioned on the outside of the cylindrical drum-receiving housing at the light pattern reading station to receive the pattern of light thereat and produce electrical signals at a number of outputs thereof corresponding to the maximum number of binary digits represented by the pattern of light having the greatest number of digits produced by the encoder drum.

If it is desired to increase the number of channel selection light-transparent areas on the encoder drum, it is merely necessary to replace the particular combination knob and encoder unit mounted in place within the drum-receiving housing by a similar combination knob and encoder unit with a correspondingly increased number of groups of light-transparent areas and projection-receiving indentations thereon, so that the new combination knob and encoder unit is automatically indexible to the greater number of positions necessary for the increased number of channels to be selected.

DESCRIPTION OF DRAWINGS

FIG. 1 is a block diagram of an exemplary phase-lock loop circuit controlling the variable frequency local oscillator of a superheterodyne receiver and controlled by the channel selection encoding assembly of the present invention;

FIG. 2 is a fragmentary perspective view of the control panel of the receiver partially shown in block form in FIG. 1, with a 23 channel combination knob and encoding unit portion of a channel section encoding assembly visible thereon;

FIG. 3 is an enlarged fragmentary view of the control panel of FIG. 2;

FIG. 4 shows the control panel of FIG. 2 with a 40 channel combination knob and encoder unit which has replaced the corresponding unit shown in FIG. 3;

FIG. 5 is a view showing the combination knob and encoder unit of FIG. 3 removed from the control panel, and the housing which receives the unit mounted on the rear of the control panel;

FIG. 6 is a rear perspective view of the housing shown in FIG. 5, with portions of the cabinet in which the housing is mounted shown in dashed lines;

FIG. 7 is a fragmentary rear perspective view of the combination knob and encoder unit shown in FIG. 5;

FIG. 8 is a rear perspective view of a combination knob and encoder unit which can replace the unit shown in FIG. 5;

FIG. 9 is a sectional view through the control panel of FIG. 3 showing in section the entire encoding assembly of FIGS. 2 and 3;

FIG. 10 is a sectional view, taken along section line 10—10 of FIG. 9;

FIG. 11 is a perspective view of a portion of the housing shown in FIG. 6, with the head of an indexing pin projecting into the interior of the housing;

FIG. 12 is a transverse sectional view of FIG. 11, taken along section line 12—12 therein;

FIG. 13 is a greatly enlarged fragmentary sectional view through the encoder drum portion of the combination knob and encoding unit, taken along section line 13—13 in FIG. 7 and shows the application of an opaque paint to the outer surface thereof and an aluminum coated Mylar layer to the inner surface thereof; and FIG. 14 is a greatly enlarged fragmentary sectional view through a modified encoder drum.

Referring now to the drawings, the channel selection apparatus 3 of the invention comprises a combination knob and encoder unit 3a insertable through an opening 2a' in a control panel 2a generally located at the front of a housing 2 of the equipment involved, which will be assumed to be a citizen band transceiver. In a manner to be described, this combination and encoder unit is rotatable into a given number of stable positions depending upon the number of channels to be selected thereby. For example, if there are 23 channels, then the knob 4 is indexable into only 23 discrete rotational positions, the particular channel selected for any given position being visible on the control panel 2a in any suitable way, such as by a number 4a generated in a manner to be explained. The channel selection apparatus 3 further includes a housing 3b mounted on the rear of the control panel 2a, as shown in FIG. 5. If the number of channels to be received is to be increased, such as from 23 to 40, it is only necessary to replace the combination knob and encoder unit 3a by the combination knob and encoder unit 3a' shown in FIG. 4, with no change whatsoever necessary in the housing 3b or the various components to be described supported by the housing 3b.

Before describing other details of the unique channel selection encoding assembly of the present invention, it would be helpful first to describe the environment in which the present invention has its most important application, namely, as a channel selection control in a citizen band transceiver. In each different discrete position of the control knob 4, a different pattern of signals appear at a number of output lines 3d which pattern of signals corresponds to the various channels or frequencies of the signals to be intercepted by an antenna 5 connected to the input 6a of an RF amplifier 6. It will be assumed that the various channels fall in the range of from 26.965 megahertz and 27.255 megahertz.

The RF amplifier has an output 6b coupled to the input 7a of a conventional mixer 7 whose output 7b is connected to the input 8a of a second mixer 8. The second mixer 8 has an output 8b coupled to the input 10a of an IF amplifier section 10. The first and second mixers 7 and 8 have second inputs 7a'–8a' connected respectively to the outputs 12b and 14b of local oscillators 12 and 14 which have frequencies which when beat with the frequencies fed to the mixer inputs 7a'–8a' produce desired intermediate frequencies which are respectively shown to be 10.695 megahertz and 455 kilohertz for the particular transceiver illustrated. The oscillator 12 is a voltage controlled oscillator 12 of a well known design which produces a frequency depending upon the magnitude of a DC voltage fed to the input 12a thereof from a phase detector 18 most desirably through a low pass filter 19.

The oscillator 14 feeding the second mixer 8 also is coupled to the input 16a of a divide by 1024 circuit 16 which produces a voltage of 10 kilohertz at the output 16b thereof. This 10 kilohertz signal is fed to the input 18a of the phase detector 18 whose other input 18a' is coupled to the output 20b of a circuit 20 identified as a divide by 128-157 circuit which produces a frequency or pulse output which is ideally 10 kilohertz. The divide by 128-157 circuit 20 receives at its input 20a the rectified output of a mixer 23 which has an input 23a connected the output 24b of an oscillator 24 which is illustrated as having a frequency of 36.380 megahertz. The mixer 23 also has an input 23a' extending from the output 12b of the voltage controlled oscillator 12. The circuit 20 is a pulse counter which produces a pulse at its output 20b when its maximum count is reached. The rate of the pulses at the pulse counter output thus depends upon the initial setting of the counter which receives its initial count setting from the outputs of a gate circuit 25, in turn, fed from the output lines 3d of the channel selection encoding assembly 3. The gate 25 is opened each time the gate 25 receives a control pulse at its input 25a, which is the pulse output of the counter circuit 20. When the pulse counter circuit 20 produces a pulse which momentarily opens the gate 25, the binary coded signal appearing on the output lines 3d of the channel selection encoding assembly 3 is set in the counter 20, so that the counter will count up to its maximum count after receiving a number of pulses depending upon the initial count set therein. The phase detector circuit 18 produces a DC voltage which depends upon the difference in the phase and frequency of the pulses fed to the inputs 18a and 18b thereof. It can than be shown that with the circuit just described the voltage controlled oscillator 12 will automatically be set at a frequency determined by the binary coded output of the channel selection encoding assembly 3.

In the most preferred form of the invention, the combination knob and encoder unit 3a is a single molded part made of synthetic plastic material, or it may be an adhesively or otherwise secured together assembly of parts also made of molded synthetic plastic material. The knob 4 is provided with ribs 4b to facilitate the gripping and turning thereof and a flanged portion 30 extending radially outwardly from the rear end portion of the knob 4. At the rear of the flange is a cylindrical skirt portion 32 having circumferentially spaced apertures or indentations 34 corresponding in number to the number of channels to be selected. The skirt portion 34 terminates in a cylindrical opaque encoding drum 36. The encoding drum 36 is provided with circumferentially spaced aligned groups of light-transparent areas or windows 38-1, 38-s, 38-3, etc. which permit the passage of light therethrough to produce different binary coded light patterns. These groups of light-transparent windows are spaced apart corresponding to the spacing of the indexing indentations 34. Each binary coded pattern of light produced by a group of the light-transparent windows identifies a particular channel which is selected when the knob 4 has a position which brings the group of light-transparent windows involved opposite a light pattern reading station of the housing 3b to be described. The synthetic plastic material out of which the knob 4, flange 30, skirt portion 32 and drum 36 is made may be a transparent synthetic plastic material. In such case, the drum 36 is, except for the light-transparent windows, coated with an opaque paint. Visible through the transparent flange when the same is back-lighted are numerals 4a indicating the various channels to be selected by the positioning of the knob 4, which numerals may be printed on a transparent plastic ring 31 which is frictionally fitted or adhesively secured to the rear face of the flange 30. The control panel 2a has a slot 37 therein (FIG. 3) about the width of one numeral and located behind the numeral carrying portion of the flange 30, and light is projected through the slot 37 to back light the numeral representing the selected channel.

Extending centrally through the encoding drum 36 is a cylindrical shaft 40 preferably made of metal, which is suitably anchored to the knob 4. As shown in FIG. 9, the shaft 40 may extend within a boss 4c where it is suitably anchored by suitable fastening means. The rear end of the shaft 40 has a locking clip-receiving recess 44 adapted to receive a suitably locking clip 46 or the like. The aforementioned aperture 2a' in the control panel 2a may be a circular aperture slightly larger than the outer circumference of the encoding drum 36 so that the encoding drum can be easily fitted through the aperture 2a'. The housing 3b has a cylindrical body 50 terminating at the front thereof in a radially outwardly extending flange 52 which engages and is suitably anchored to the rear of the control panel 2a'. As illustrated, the housing 3b has a rear wall 47 having a central bearing-forming sleeve 49 into which the rear portion of the shaft 40 extends. The clip-receiving recess 44 of the shaft 40 is located beyond the rear wall 47 of the housing 3b so that clip 46 may be conveniently applied thereto to hold the combination knob and encoder unit in place when the combination knob and encoder unit is fully mounted within the housing 3b.

As perhaps best shown in FIG. 5, at the particular position of the housing body 50 where the light pattern reading station is located there is provided one or more light-transparent apertures or windows 56 of a size to permit the light beam passing through the light-transmitting windows on the encoding drum 36 at the light pattern reading station to pass to the outside of the housing. A photocell unit 59 or the like is supported on the outside of the housing body 50 opposite the windows 56 at the light pattern reading station to intercept the light beams passing through the windows 56. The housing body 50 may have an inner diameter somewhat greater than the outer diameter of the encoding drum 36, so that the groups of light-transparent windows 38-1, 38-2, etc. may be brought into contiguous relation to the housing windows 56 at the light pattern reading station. Supported on the rear wall 47 of the housing 36 is a light unit 62 having a socket holding a removable light bulb 62b. Light bulb 62b may have a very limited axial extent in comparison to the length of the housing body 50 and the encoding drum 36 fitting therein. The bulb 62b will be located within the encoding drum 36 when the combination knob and encoder unit is fully mounted within the housing 3b. The light bulb 62b is most advantageously mounted on the side of the housing 3b remote from the housing windows 56 so that a more even distribution of light can occur at the windows 56 by multiple reflections of the light within the inner surface of the encoding drum 36.

Refer now more particularly to FIG. 13 which illustrates in a greatly enlarged sectional view the construction of the encoding drum 36. As there shown, the light-transmitting areas or windows 38-1, 38-2, etc. are provided by radially extending apertures extending completely through the drum. After the formation of these apertures, the outer surface of the drum may be conveniently coated with an opaque ink or paint 57. A Mylar layer 59a is adhesively secured to the inner surface of the drum 36. The Mylar layer is coated on its exposed side with a suitable reflecting material 59b, such as aluminum. The light-transmitting windows 38-1, 38-2 etc. may be formed after the Mylar layer is applied to the inner surface of the drum, so that these apertures extend completely through the drum and the aluminum coated Mylar layer involved.

In the alternative, the drum could be constructed as shown in FIG. 14 wherein the drum 36 is molded of semi-transparent, partially reflective material and the light-transmitting windows illustrated therein are molded therein as indentations within the body of material forming the drum 36. An opaque coating 57 can be easily applied to the surface of the drum thereby leaving the indentations as sources of light.

The means for holding the combination knob and encoder unit 3a in any of its indexable positions is shown most clearly in FIGS. 11 and 12 to which reference should now be made. As best shown in FIG. 12, in its most preferred form this indexing means may comprise a housing 68 mounted on the outside of the housing body 50 and having an indexing pin 70 projecting into the interior of the housing body 50 and a coil spring 72 which urges the pin 70 into the housing body. The pin 70 may be provided with a ball-shaped head portion 70a adapted readily to enter any one of the indentations 54 formed on the skirt portion 32 of the combination knob and encoder unit 3a.

It will be recalled that FIGS. 4 and 8 illustrate a combination knob and encoder unit 3a' which provides for a selection of 40 rather than only 23 channels, as in the case of the combination knob and encoder unit 3a. Accordingly, it has 40 equally circumferentially spaced indexing indentations 34', an indicia carrying ring 31' having indicia identifying 40 different channels, and 40 groups of light-transparent windows 38-1', 38-2', etc. on its encoding drum 36'. It should be apparent, therefore, that one can modify the receiving system with the phase lock loop frequency determining circuit shown in FIG. 1 by merely removing the combination knob and encoder unit 3a and replacing the same by the unit 3a'. No changes whatsoever need to be made in the housing 3b or the various parts carried thereby just described.

The indexing indentations 34 and 34' of the combination knob and encoder units 3a and 3a' are positioned so that a different numeral 4a is brought opposite the slot 37 in the control panel 2a. This numeral is back-lighted by lighting means 75 attached to the housing 3b. The lighting means 75 includes a socket 75a in which is removably mounted a light bulb 75b located contiguous to the slot 37.

It should be understood that numerous modifications may be made in the most preferred forms of the invention described without deviating from the broader aspects of the invention.

I claim:

1. Rotary digital encoding apparatus comprising, in combination: a combination knob and encoder unit including a manually operable knob connected to a cylindrical light opaque encoder drum extending coaxially rearwardly from the knob, said drum having formed therein at various circumferentially spaced points therearound axially aligned groups of light-transparent areas permitting the passage of light through the drum thereat, each group of said axially aligned light-transparent areas being distinctively positioned to provide a binary coded light pattern when light is transmitted therethrough which pattern constitutes a given distinctive number or other information; support means for said combination knob and encoder unit for removably and rotatably supporting the same for rotation about an axis coaxial with the longitudinal axis of said drum; the combination knob and encoder unit having drum position indexing means circumferentially spaced at points corresponding to the spacing of said groups of light transparent areas; associated means cooperating with said drum position indexing means for releasably holding said combination knob and encoder unit in any one of a number of different rotatable positions which bring said respective groups of light-transparent areas successively to a light pattern reading station; light source means on one side of said drum for directing light at least along the surface of the drum brought to said light pattern reading station and through the group of said light-transparent areas thereat so that a binary coded pattern of light appears on the opposite side of the drum; light pattern-responsive means on said other side of said drum and responsive to the light pattern transmitted through the drum at said light pattern reading station for providing a binary coded electrical output corresponding to the light pattern involved; and said combination knob and encoder unit being removable as a unit from said supporting means so that it can be replaced by a similarly sized combination knob and encoder unit but having a different number of differently circumferentially spaced groups of light-transparent areas and correspondingly spaced drum position indexing means thereon.

2. The rotary digital encoding apparatus of claim 1 wherein said light source means is located within said drum and has an axial extent much smaller than the portions of said drum encompassed by the longest of said groups of light-transparent areas, the inner surface of said drum being a reflective surface so that the light from said light source means reflects off of the inner surface of said drum to project a substantial amount of light on any group of light-transparent areas positioned at said light pattern reading station, and said light pattern responsive means being positioned on the outside of said drum adjacent to said light pattern reading station so only the light transmitted through the latter group of light-transparent areas impinges upon the active portion of said light pattern responsive means.

3. The rotary digital encoding apparatus of claim 2 wherein said light means is spaced substantially from said light pattern reading station so the light reaching the group of light-transparent areas of said drum opposite said light pattern reading station is a result of multiple reflections of the light over the inner surface of said drum.

4. In combination with a control panel having an aperture therein, rotary digital encoding apparatus comprising; a drum-receiving housing secured to said control panel and having a drum-receiving aperture in the front thereof aligned with said aperture in said panel, shaft-receiving means for rotatably supporting a shaft, and light source means in said housing; a combination knob and encoder unit insertable into said housing through said aperture in said panel, the combination knob and encoder unit including a cylindrical drum open at the rear thereof to be movable around and beyond said light means supported in said drum-receiving housing, the drum having circumferentially spaced groups of light-transparent areas thereon, each group of which are axially aligned and through which light from said light source means passes through at least the group of light-transparent areas positioned at a light pattern reading station in said housing, a knob exposed and manually accessible from the front of said panel when said combination knob and encoder unit is fully mounted in said housing, a shaft movable into engagement with said shaft-receiving means when the combination knob and encoder unit is fully inserted into said housing from the front of said panel, circumferentially spaced drum position indexing means spaced in accordance with the circumferentially spaced groups of light-transparent areas on said drum; and associated means mounted externally of said combination knob and encoder unit for releasably engaging with one of said drum position indexing means in the various rotational positions thereof which brings respective groups of light-transparent areas opposite said light pattern reading station.

5. The combination of claim 4 wherein said drum-receiving housing has a cylindrical wall extending rearwardly from said panel in alignment with the margins of said aperture in said panel, said drum of said combination knob and encoder unit when fully mounted in said housing being contiguous to said cylindrical wall said cylindrical wall having light transmission window means at said light pattern reading station for transmitting the light transmitted through the group of light-transparent areas of the drum at said station, and said light pattern responsive means being mounted on the outside of said cylindrical wall adjacent to said light transmitting window means.

6. The combination of claim 4 wherein said drum position indexing means of said combination knob and encoder unit are radially outwardly facing recesses formed at the outer end of said drum, and said associated means comprising resiliently radially projecting means positioned inwardly to enter at least one of said recesses.

7. The combination of claim 4 further provided with a second combination knob and encoder unit insertable into said housing through said aperture in said panel, the second combination knob and encoder unit being of similar construction to the first mentioned combination knob and encoder unit and being substitutable therefor in said housing, except that it has a greater number of groups of light-transparent areas and indexing means than that of the first mentioned combination knob and encoder unit so it produces a correspondingly greater number of light patterns and indexing positions.

8. Rotary digital encoding apparatus comprising, in combination: a combination knob and encoder unit including a cylindrical light opague encoder drum having circumferentially spaced groups of light-transparent areas thereon, each group of which are axially aligned and permit light to pass through the drum radially to form a light pattern constituting binary coded information representing a distinctive number or other information, and an outer knob portion to be grasped by an operator rotating the combination knob and encoder unit; and a cylindrical drum-receiving housing having an aperture at one end into which said encoder drum passes, the housing having a rear wall with a shaft-receiving bearing thereon; the combination knob and encoder unit having a shaft adapted to engage said bearing when the combination knob and encoder unit is fully inserted within said housing; said housing rear wall supporting light means adapted to pass within the drum when the combination knob and encoder unit is fully inserted within said housing; said combination knob and encoder unit having spaced recesses therein circumferentially spaced in accordance with the spacing of said groups of light-transparent areas on said drum; spring-urged radially extending projecting means adapted releasably to enter one of said recesses so that the combination knob and encoder unit can be adjusted to any one of a number of different angular positions; said housing having a light pattern reading station opposite which the different groups of light-transparent areas on said drum are brought as the combination knob and encoder unit is rotated to said different positions; and light pattern responsive means at said light pattern reading station of said housing for intercepting the light pattern passing through the group of light-transparent areas of the drum opposite the light pattern reading station.

9. The encoding apparatus of claim 1 wherein said encoder drum is made of a molded semi-transparent partically reflective synthetic plastic material and of a thickness to be substantially opaque, but which is substantially transparent to light in thin sections, said drum having circumferentially spaced, and said light-transparent areas being indentations molded therein reducing the thickness thereof to a point permitting the substantial passage of light through the drum indentations thereat.

10. Rotary digital encoding apparatus comprising, in combination: a cylindrical encoder drum made of a molded semi-transparent partically reflective synthetic plastic material and of a thickness to be substantially opaque, but which is substantially transparent to light in thin sections, said drum having circumferentially spaced axially aligned groups of light-transparent indentations molded therein reducing the thickness thereof to a point permitting the substantial passage of light through the drum indentations thereat, each group of said axially aligned light-transparent being distinctively positioned to provide a binary coded light pattern when light is transmitted therethrough which pattern constitutes a given distinctive number or other information; support means for rotatably supporting the same for rotation about an axis coaxial with the longitudinal axis of said drum; drum position indexing means for releasably holding said encoder drum in any one of a number of different positions which bring said respective groups of light-transparent indentations successively to a light pattern reading station; light source means on one side of said drum for directing light at least along the surface of the drum brought to said light pattern reading station and through the group of said light-transparent indentations thereat so that a binary coded pattern of light appears on the opposite side of the drum; and light pattern-responsive means on said other side of said drum and responsive to the light pattern transmitted through drum at said light pattern reading station for providing a binary coded electrical output corresponding to the light pattern involved.

* * * * *